United States Patent
Sood et al.

(10) Patent No.: US 9,054,684 B1
(45) Date of Patent: Jun. 9, 2015

(54) SINGLE EVENT UPSET ENHANCED ARCHITECTURE

(71) Applicant: Xilinx, Inc., San Jose, CA (US)

(72) Inventors: Santosh Kumar Sood, New Delhi (IN); Praful Jain, Ghaziabad (IN); Ramakrishna K. Tanikella, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 13/848,689

(22) Filed: Mar. 21, 2013

(51) Int. Cl.
*H03K 5/125* (2006.01)
*G01R 31/3181* (2006.01)

(52) U.S. Cl.
CPC .......... *H03K 5/125* (2013.01); *G01R 31/31816* (2013.01)

(58) Field of Classification Search
CPC ................................................. G01R 31/31816
USPC ......... 327/97, 18, 23, 99, 199, 200, 201, 202, 327/203, 208, 210, 211, 212, 213, 214, 218, 327/225, 356
See application file for complete search history.

(56) References Cited

U.S. PATENT DOCUMENTS 7,278,074 B2    10/2007  Mitra et al.
2011/0022908 A1 *  1/2011  Wang et al. ................... 714/726

OTHER PUBLICATIONS

Gong. R, "Modified Triple Modular Redundancy Structure based on Asynchronous Circuit Technique", Defect and Fault Tolerance in VLSI Systems, DFT'06, 21st IEEE International Symposium, Oct. 2006, pp. 1-11.
Mitra S., "Built-In Soft Error Resilience for Robust System Design", ICICDT '07, May 30-Jun. 1, 2007, pp. 1-6.
Xilinx, 7 Series FPGAs Configurable Logic Block, User Guide, UG474 (v1.4), Nov. 5, 2012, pp. 1-72, 2100 Logic Drive, San Jose, CA US.

* cited by examiner

*Primary Examiner* — Lincoln Donovan
*Assistant Examiner* — Jung Kim
(74) *Attorney, Agent, or Firm* — Kevin T. Cuenot

(57) ABSTRACT

A circuit block within an integrated circuit includes a multiplexor (225, 625) configured to pass either a first signal or a second signal, wherein the first signal is independent of the second signal. The circuit block further includes a first flip-flop (210, 610) configured to receive an output of the multiplexor and a second flip-flop (215, 615) configured to receive the second signal. In a first mode of operation, the multiplexor passes the first signal to the first flip-flop. Further, the first flip flop and the second flip-flop operate independently of one another. In a second mode of operation, the multiplexor passes the second signal to the first flip-flop. Further, the first flip-flop and the second flip-flop both receive the second signal.

7 Claims, 7 Drawing Sheets

SINGLE EVENT UPSET ENHANCED ARCHITECTURE

FIELD OF THE INVENTION

This specification relates to integrated circuits and, more particularly, to an architecture that is resistant to single event upsets.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs also can be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

Given the ever smaller feature sizes of modern ICs, including programmable ICs, such devices have become more vulnerable to single event upsets. Other factors such as decreased junction capacitance and reduced operating voltages found in many modern ICs has also led to an increased rate of occurrence of single event upsets. A single event upset (SEU) is a change of state induced within a micro-electronic device such as a microprocessor, a semiconductor memory, or the like. In general, an SEU is caused by one or more particles or electromagnetic radiation striking a node in the micro-electronic device. Because the affected device is not permanently damaged, SEUs are considered non-destructive events. Only the output (signal) of the affected device is altered. Correspondingly, several changes of state induced within a device are referred to as a multiple bit upset (MBU).

SUMMARY

A circuit block within an integrated circuit (IC) includes a multiplexor configured to pass either a first signal or a second signal. The first signal is independent of the second signal. The circuit block also includes a first flip-flop configured to receive an output of the multiplexor and a second flip-flop configured to receive the second signal. In a first mode of operation, the multiplexor passes the first signal to the first flip-flop. Further, the first flip flop and the second flip-flop operate independently of one another. In a second mode of operation, the multiplexor passes the second signal to the first flip-flop. Further, the first flip-flop and the second flip-flop both receive the second signal.

An IC includes a configurable circuit block having a function generator, a first flip-flop, and a second flip-flop. The function generator includes a first function generator output connected to an input of the first flip-flop and a second function generator output, independent of the first function generator output, connected to an input of the second flip-flop. The IC further includes C-element block. In a first mode of operation, the first flip-flop operates on the first function generator output and the second flip-flop operates on the second function generator output. In a second mode of operation, the second function generator output is connected to the input of the first flip-flop and the input of the second flip-flop. Further, the C-element block is configured to process a first result signal generated by the first flip-flop and a second result signal generated by the second flip-flop.

An IC includes a circuit block that is configurable to implement a first mode of operation in which a first flip-flop receives a first signal output from a function generator and a second flip-flop receives a second signal output from the function generator that is independent of the first signal. The circuit block is further operable to implement a second mode of operation in which the first flip-flop and the second flip-flop receive a same signal output from the function generator. The IC also includes a C-element block configured to process a first result signal generated by the first flip-flop and a second result signal generated by the second flip-flop when the circuit block is in the second mode of operation.

DETAILED DESCRIPTION OF THE DRAWINGS

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

This specification relates to integrated circuits (ICs) and, more particularly, to an architecture that is resistant to a single event upset (SEU). In accordance with the inventive arrangements disclosed within this specification, a circuit block can implement one of two different modes of operation. One mode of operation provides for normal, or substantially normal, operation. The second mode of operation provides an increased level of SEU protection. As such, a circuit designer is able to determine whether the circuit block operates in the first or second mode of operation according to the needs and/or requirements of the particular application that is implemented within the integrated circuit.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
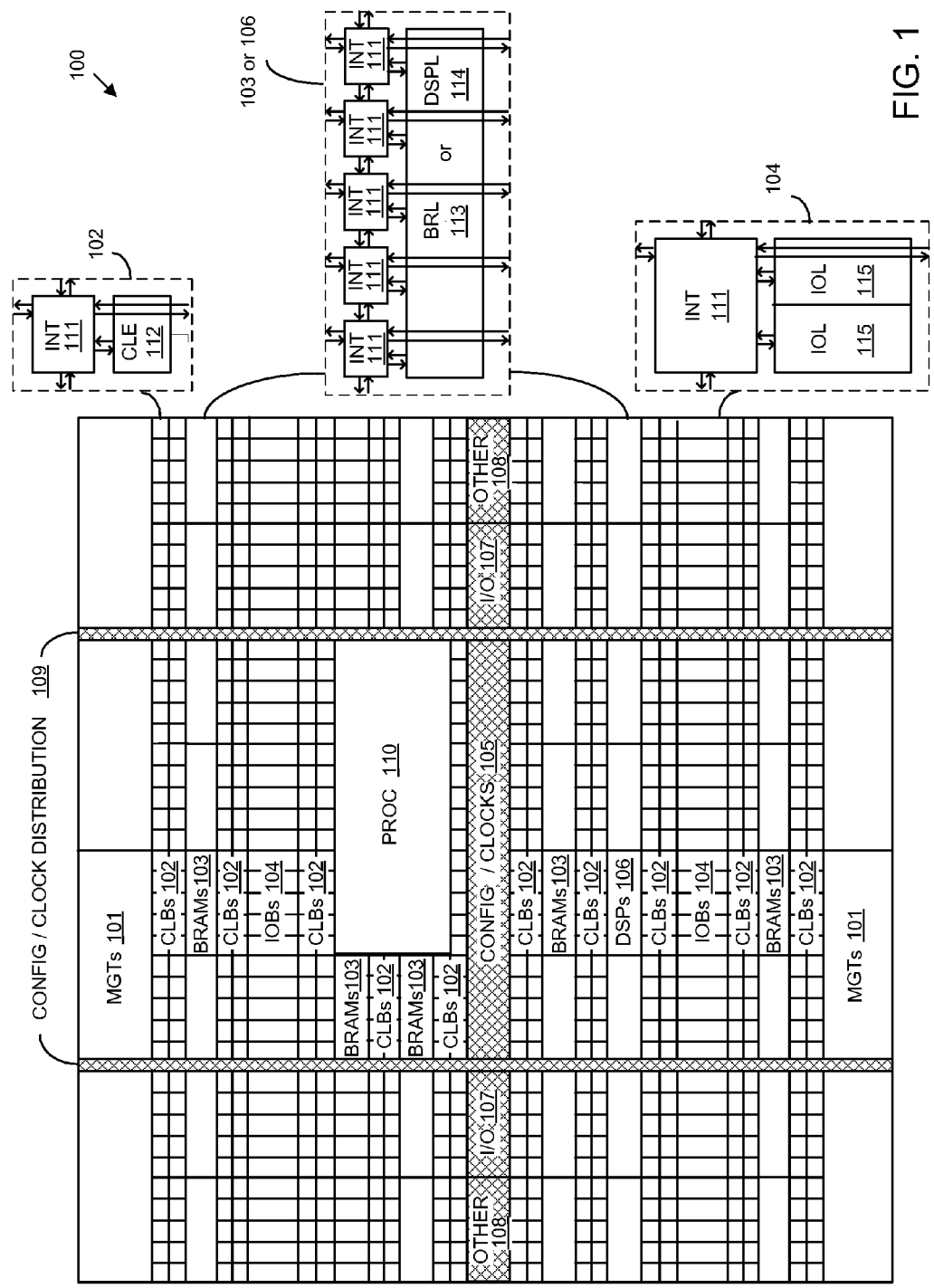
FIG. 1 is a block diagram illustrating an exemplary architecture for an integrated circuit (IC).

FIG. 1 is a block diagram illustrating an exemplary architecture 100 for an IC. In one aspect, architecture 100 can be implemented within a field programmable gate array (FPGA) type of IC. As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, the INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. In one aspect, the CLE 112 of one or more of the CLBs 102 can be configured to implement a first mode of operation or a second mode of operation. The first mode of operation, to be described within this specification in greater detail, is a normal mode of operation. The second mode of operation, also to be described within this specification in greater detail, provides increased protection from SEUs as compared to the first mode of operation.

A BRAM 103 can include a BRAM logic element (BRL) 113 in addition to one or more INTs 111. Typically, the number of INTs 111 included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, can be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

In one aspect, PROC 110 is implemented as dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks can be utilized to form a "soft processor" in that the various blocks of programmable circuitry can be used to form a processor that can execute program code as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 103 and BRAMs 103 can be considered programmable circuitry of the IC.

In general, the functionality of programmable circuitry is not established until configuration data is loaded into the IC.

A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation of the one or more embodiments disclosed within this specification.

Figure 2:
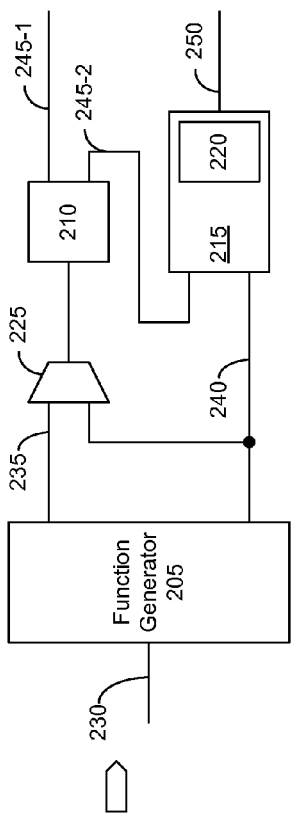
FIG. 2 is a block diagram illustrating an exemplary portion of a configurable circuit block.

FIG. 2 is a block diagram illustrating an exemplary portion of a configurable circuit block. In one example, FIG. 2 illustrates a portion of a CLB, i.e., the CLE, as described with reference to FIG. 1. In general, the architecture of a CLB varies according to the particular type or model of programmable IC in which the CLB is implemented. Typically, a CLB includes function generators that are paired with one or more memory elements such as flip-flops (flops). One example of a function generator is a lookup table. In some cases, a CLB is formed of two slices. Each slice includes one or more function generators and a plurality of memory elements. In one particular example, each function generator of a slice is paired with two different flops.

FIG. 2 illustrates a portion of a slice of a CLB that includes a function generator 205, a flop 210, and a flop 215. As noted, each of flops 210 and 215 is a memory element. In one aspect, flops 210 and 215 are implemented as "D-type" flops. As generally known, a D-type of flop tracks the input signal and makes transitions at the output that match those of the input signal. As such, the D-type flop stores the value that is on the data line.

Function generator 205 is configured, through the loading of configuration data, to implement any of a variety of different functions responsive to input signal 230. In one aspect, function generator 205 can be implemented as a lookup table, though any of a variety of function generators can be used. In a further aspect, input signal 230 is a multi-bit input signal. For example, input signal 230 can be a five or a six bit input signal. In the pictured example, function generator 205 includes two outputs. The first output is connected to signal 235. The second output is connected to signal 240. The two outputs of function generator 205 operate independently of one another. For example, signal 235 can convey a result of a first function, while concurrently signal 240 conveys a result of a second and different function. Thus, signals 235 and 240 are independent of one another and can be in different states.

Signal 235 is provided to an input of multiplexer 225. Signal 240 also is provided to an input of multiplexer 225 and to an input of flop 215. Depending upon the selected mode of operation, multiplexer 225 outputs, or passes, either signal 235 or signal 240 to an input of flop 210. Flop 210 is configured with two outputs. The first output of flop 210 is connected to signal 245-1. The second output of flop 210 is connected to signal 245-2. Signals 245-1 and 245-2 are equivalent, or same, signals. Thus, signals 245-1 and 245-2 will be equivalent to either signal 235 or signal 240 depending upon the mode of operation that is implemented. In one aspect, signal 245-2 is output from flop 210 through the inclusion of an additional wire. An additional driver may also be included in flop 210 to drive signal 245-2.

Flop 215 has two inputs. A first input of flop 215 is connected to signal 240. A second input of flop 215, also referred to as the SEU input, is connected to signal 245-2. In the pictured example, flop 215 includes a C-element block 220. Flop 215 includes an output that is connected to signal 250. In one aspect, the output of flop 215 is the same as the output of C-element block 220.

When implementing the first mode of operation, multiplexer 225 is set, through the loading of a configuration bitstream, to pass signal 235 to the input of flop 210. For example, the control signal provided to multiplexer 225 to implement either the first mode of operation or the second mode of operation is provided from a configuration memory cell loaded with a state or value upon the loading of the configuration bitstream. Thus, flop 210 outputs a clocked version of signal 235 as signal 245-1, which is the result signal of flop 210. Though signal 245-2 is equivalent to signal 245-1, signal 245-2, which is provided to the SEU input of flop 215, is gated during the first mode of operation. In one aspect, signal 245-2 is gated within flop 210. In another aspect, signal 245-2 is gated within flop 215.

Also while in the first mode of operation, flop 215 receives signal 240 and outputs a clocked version of signal 240 as signal 250. Operation of C-element block 220 will be described in greater detail. In general, however, C-element block 220 is transparent in the first mode of operation. As such, signal 250 is a clocked version of signal 240. Accordingly, while in the first mode of operation, each of flops 210 and 215 operates independently of the other. Each receives a separate, e.g., independent, and different input signal to be processed.

When implementing the second mode of operation, the structure illustrated in FIG. 2 provides increased protection from SEUs. In the second mode of operation, multiplexer 225 is set, through the loading of a configuration bitstream, to pass signal 240 to the input of flop 210. Further, signal 245-2 is not gated and is provided to the SEU input of flop 215. Each of signals 245-1 and 245-2 is a clocked version of signal 240. Flop 215 receives signal 240 and signal 245-2 at the SEU input. As noted, both signals 240 and 245-2 are equivalent.

In one aspect, at least with regard to signal 240, flop 215 functions as a D-type flop. For example, flop 215 generates a clocked version of signal 240 internally, which is provided to C-element block 220. The clocked version of signal 240 provided to C-element block 220 can be considered a result signal generated by flop 215, albeit internal to flop 215. C-element block 220 receives the clocked version of signal 240 and signal 245-2, which is passed through from the SEU input. Flop 215 outputs signal 250. In one aspect, C-element block 220 is configured to generate signal 250, e.g., dual redundancy output signal, responsive to the clocked version of signal 240 and signal 245-2. Signal 250, as generated by C-element 220 during the second mode of operation, does not change state responsive to a state change when either the clocked version of signal 240, in reference to the internal result signal within flop 215, or signal 245-2, as received by C-element block 220, changes state. In this regard, signal 250 is a dual redundancy output signal when in the second mode of operation.

By including C-element block 220 within flop 215 as described, dual redundancy is provided. It should be appreciated that signals 240 and 245-2 can be spaced sufficiently far apart on the IC so that a particle striking signal 240 is unlikely to also strike signal 245-2 and vice versa.

Inclusion of C-element block 220 within a configurable circuit block as described with reference to FIG. 2 provides several advantages over other conventional SEU mitigation techniques. In one aspect, the circuit structure described with reference to FIG. 2 utilizes fewer components than other SEU mitigation techniques such as triple modular redundancy (TMR). TMR triplicates a signal, thereby requiring three flops, e.g., one flop for each of the three signals. Further, a voter circuit is required that operates upon the three signals. Due to the configuration limitations of many configurable circuit blocks, the voter circuit must be implemented in a different configurable circuit block than the one in which the signal is triplicated. Accordingly, implementing TMR requires two configurable circuit blocks as opposed to one. As such, implementing TMR requires substantially more area of the IC than the circuit structure illustrated in FIG. 2.

The circuit structure illustrated in FIG. 2 also reduces the number of routing resources, e.g., wires, INTs, programmable interconnection points (PIPs), etc., of the IC needed to implement SEU protection. The circuit structure of FIG. 2 utilizes no additional routing resources in terms of interconnection circuitry outside of the configurable circuit block. As such, a small number of configuration memory cells are required, e.g., only several, to enable the second mode of operation for improved SEU protection.

As noted, when using TMR, a first configurable circuit block triplicates a signal. Each triplicated signal is routed to a second configurable circuit block implementing the voter circuit. The routing described requires a significant number of configuration memory cells to program the programmable interconnect circuitry to connect the first configurable circuit block to the second configurable circuit block. The reduced number of configuration memory cells needed by the circuit structure of FIG. 2 compared to a TMR implementation leads to reduced SEU susceptibility of the circuit structure of FIG. 2 compared with that of TMR.

Accordingly, the circuit structure of FIG. 2 provides enhanced SEU protection while avoiding the routing congestion, increased configuration memory cell SEU vulnerability, and increased configurable circuit block usage required to implement other SEU strategies such as TMR.

In addition, when operating in the second mode of operation, the circuit structure of FIG. 2 provides improved performance over TMR as the C-element block is located within the particular configurable circuit block in which SEU protection is needed. C-element block 220, though functioning differently in the first mode of operation than in the second mode of operation, remains at least partially in the signal path of the circuit structure of FIG. 2 whether operating in the first mode of operation or the second mode of operation. As such, a minor performance penalty is incurred in first mode of operation compared with a conventional programmable circuit block without C-element block 220 included therein.

Other techniques for addressing SEUs include the use of a dual interlocked storage cell (DICE) to harden the circuit block from SEUs. DICE, however, requires significantly more area than a conventional configurable circuit block without an enhanced SEU mode. Moreover, implementation of a DICE technique requires substantial redesign of the configurable circuit block and, in particular, the flops.

The circuit structure described with reference to FIG. 2 provides other advantages over both TMR and DICE techniques. For example, the circuit structure of FIG. 2 provides improved clock-to-Q and reduced power consumption over both TMR and DICE techniques. The circuit structure of FIG. 2 reduces the number of available flops by a factor of two, whereas TMR reduces the available flops by a factor of three. The circuit structure of FIG. 2 requires approximately a 0.25% increase in die area, whereas DICE requires approximately a 3.5% increase is die area.

Figure 3:
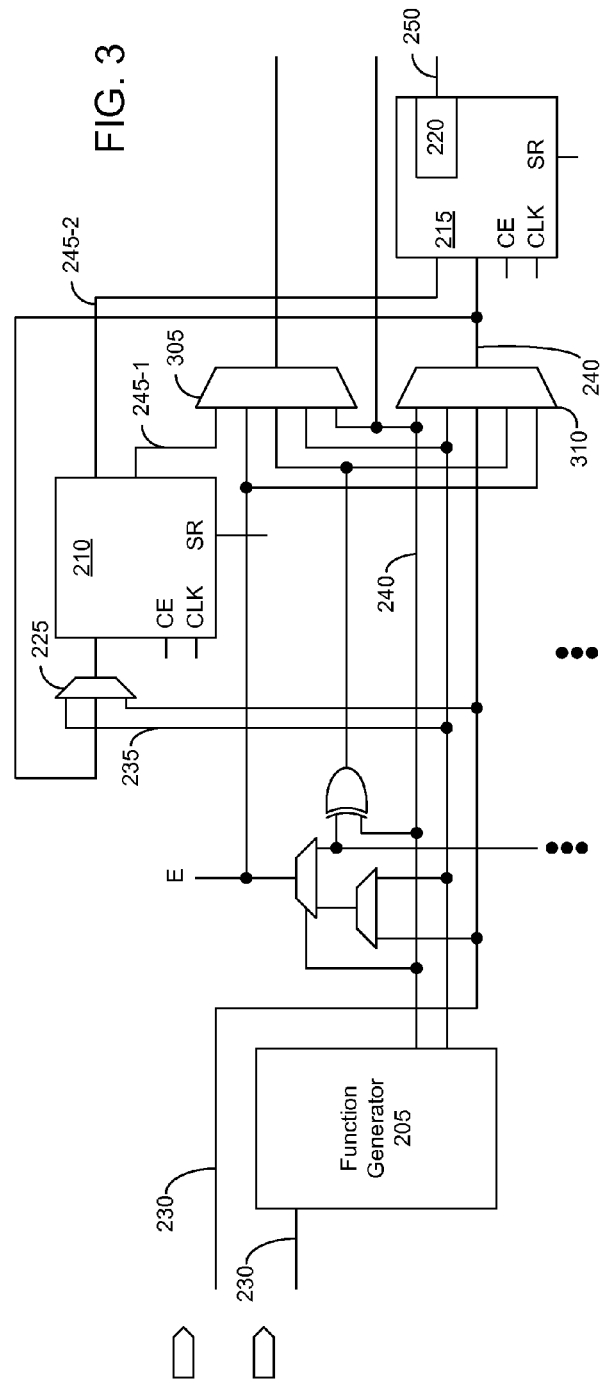
FIG. 3 is a block diagram illustrating a more detailed illustration of the portion of the configurable circuit block shown in FIG. 2.

FIG. 3 is a block diagram illustrating a more detailed illustration of the portion of the configurable circuit block shown in FIG. 2. As noted, FIG. 3 illustrates a portion of a configurable circuit block. The structure illustrated in FIGS. 2 and 3 can be replicated several times to implement a slice and/or a CLB as previously described. Further illustrations of a programmable logic block can be found within "7 Series FPGAs Configurable Logic Block User Guide," UG474 (v.1.4) Nov. 5, 2012. As noted, the particular architecture of the CLB can vary according to the model and/or type of IC used. As such, the references and examples provided within this specification are for purposes of illustration only and are not intended to be limiting.

As pictured in FIG. 3, signal 230 is provided to function generator 205. An unprocessed version of signal 230 is also provided that bypasses function generator 205 and which is available for use by other circuit structures illustrated in FIG. 3. Additional multiplexers 305 and 310 are included which provide further flexibility in terms of the potential signals that can be output from the configurable circuit block. Clock (CLK), clock enable (CE), and set/reset (SR) signals are not shown to simplify the illustrated circuitry. Notwithstanding the additional circuitry used to generate a further output D and the addition of multiplexers 305 and 310, the circuitry illustrated in FIG. 3 operates substantially similar to that described with reference to FIG. 2.

Figure 4:
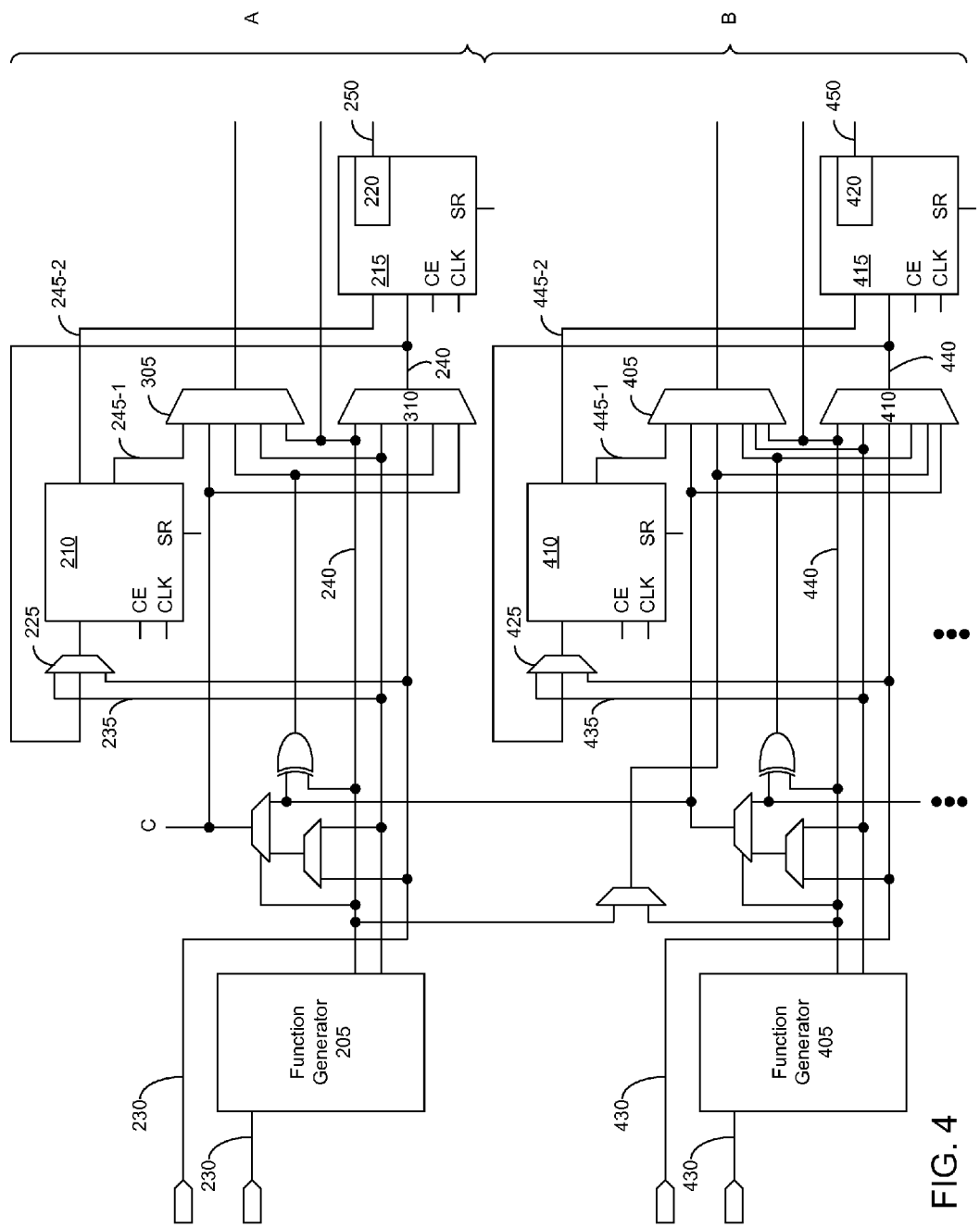
FIG. 4 is a block diagram illustrating an example of a configurable circuit block including multiple instances of the circuit structure of FIG. 3.

FIG. 4 is a block diagram illustrating an example of a configurable circuit block including multiple instances of the circuit structure of FIG. 3. FIG. 4 illustrates that for a given configurable circuit block, or CLB as the case may be, the circuit structure described with reference to FIGS. 2 and 3, shown as instance A, can be replicated one or more times. For example, a configurable circuit block can include one, two, three, four, or more instances of the circuitry described with reference to FIG. 2.

As pictured in FIG. 4, an additional instance B of the circuitry of FIG. 2 has been included. Instance B includes a function generator 405, multiplexers 405, 410, and 425, flop 410, and flop 415. Function generator 405 receives input signal 430 and generates output signals 435 and 440. Multiplexer 425 passes signal 435 in the first mode of operation to flop 410 and passes signal 440 in the second mode of operation to flop 410. Flop 410 outputs signals 445-1 and 445-2. Flop 415 receives signal 440 as an input and signal 445-2 as an SEU input. Flop 415 further includes a C-element block 420.

Instance B operates substantially the same as instance A as described with reference to FIGS. 2 and 3. Instance A and instance B, however, can be controlled independently through the loading of configuration data. For example, both instance A and instance B can be operated in the first mode of operation concurrently. Both instance A and instance B can be operated in the second mode of operation concurrently. Instance A can be operated in the first mode of operation concurrently with instance B operating in the second mode of operation. Finally, instance A can be operated in the second mode of operation concurrently with instance B operating in the first mode of operation. As such, a single configurable circuit block can provide normal operation for some signals and enhanced SEU protection for others concurrently.

Figure 5:
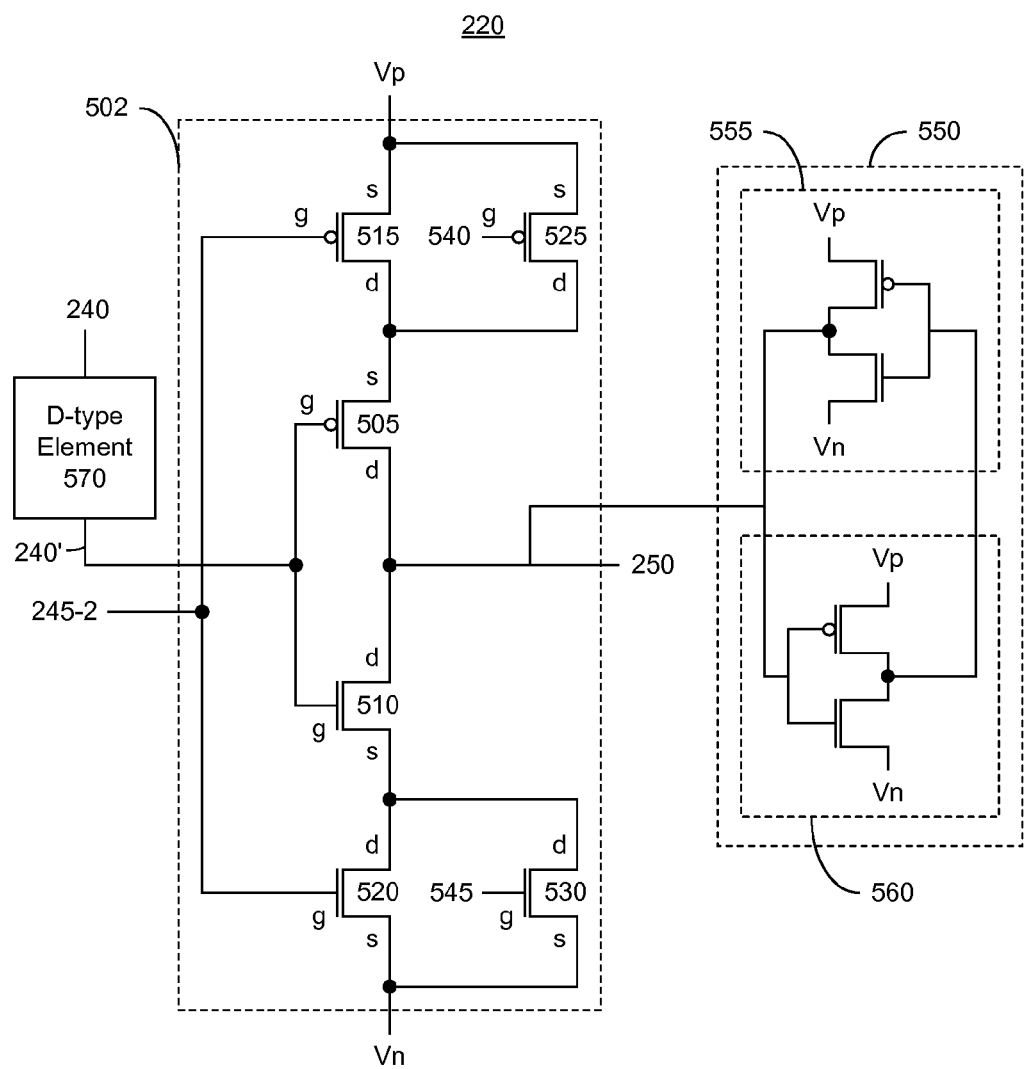
FIG. 5 is a circuit diagram illustrating an exemplary implementation of the C-element block of FIGS. 2-4.

FIG. 5 is a circuit diagram illustrating an exemplary implementation of C-element block 220 of FIGS. 2-3. As pictured, C-element circuit block 220 includes a C-element 502 and a latch 550. C-element block 220, in general, implements a double voter circuit providing dual modular redundancy. As shown, C-element 502 includes an inner (e.g., first) inverter formed of a pair of transistors. The inner inverter is formed of P-type metal-oxide field effect transistor (PMOS) 505 and an N-type metal-oxide field effect transistor (NMOS) 510.

Signal 240, which is provided to an input of flop 215, enters D-type element 570, which outputs a clocked version of signal 240 depicted as signal 240'. D-type element 570 is not part of C-element block 220, but is included in flop 215 and represents the conventional functionality of a D-type flop. Signal 240', which can be considered the internally generated result signal of flop 215 as previously described, is connected to the gate of each of PMOS 505 and NMOS 510. Signal 245-2 is connected to the gate of PMOS 515 and NMOS 520. PMOS 515 and NMOS 520 form a transistor pair implementing an outer (e.g., a second) inverter of C-element 502.

PMOS 525 is in parallel with PMOS 515. NMOS 530 is in parallel with NMOS 520. PMOS 525 and NMOS 530 are used for configuration purposes to selectively implement the first mode of operation or the second mode of operation. As shown, the gate of PMOS 525 receives a configuration signal 540. The gate of NMOS 530 receives a configuration signal 545. In one aspect, configuration signals 540 and/or 545 are generated from a configuration memory cell that is loaded to a particular state or value when a configuration bitstream is loaded into the particular programmable IC in which C-element block 220 is implemented. As such, either the first operating mode or the second operating mode is selected upon configuration, e.g., loading of a configuration bitstream, into the programmable IC.

Signal 545 is an inverted version of signal 540. When in the first mode of operation, e.g., normal operation, signal 245-2 is gated and, as such, is not a valid data signal as provided to the gates of PMOS 515 and NMOS 520 within flop 215. Accordingly, signal 245-2 does not transition. Further, the first mode of operation is effectuated by setting signal 540 low and signal 545 high. This effectively biases PMOS 525 to pass current between the source and drain (as a short circuit) to operate as a closed switch. NMOS 530 is also biased to pass current between the source and drain (as a short circuit) to operate as a closed switch. With PMOS 525 closed and NMOS 530 closed, the state of PMOS 515 and NMOS 520 becomes irrelevant. Only the transistor pair formed of PMOS 505 and NMOS 510 operates with signal 240'. In that case, signal 250 is an inverted version of signal 240'. It should be appreciated that further inverters can be used to output signal 240' as signal 250.

Latch 550 is implemented to include an inverter 555 and an inverter 560. Inverters 555 and 560 are arranged in a positive feedback configuration. With signal 250 being connected to an output of inverter 555 and an input of inverter 560, signal 250 is reinforced and stabilized. Signal 250 still changes state with signal 240' despite the stabilization from circuit structure 550 in the first mode of operation.

When in the second mode of operation, signal 245-2 is not gated. Further, signal 540 is high thereby causing PMOS 525 to not pass current between the source and gate (as an open circuit) and operate as an open switch. Signal 545 is low thereby causing NMOS 530 to not pass current (as an open circuit) and operate as an open switch. With both of PMOS 525 and NMOS 530 acting as open circuits, operation of PMOS 515 and NMOS 520, forming an inverter, becomes relevant.

In general, since signals 240' and 245-2 are equivalent in the second mode of operation, PMOS 505 and PMOS 515 behave the same, e.g., open and close at the same time. PMOS 505 and PMOS 515 pass current between gate and source when signals 240' and 245-2 are low and do not pass current between gate and source when signals 240' and 245-2 are high. Similarly, NMOS 510 and NMOS 520 behave the same, e.g., open and close at the same time. NMOS 510 and NMOS 520 do not pass current between gate and source when signals 240' and 245-2 are low and pass current between gate and source when signals 240' and 245-2 are high. In the second mode of operation, PMOS 505, PMOS 515, NMOS 510, and NMOS 520 function as a single, larger inverter.

Latch 550 serves to reinforce the state of signal 250. In the second mode of operation, if either signal 240' or signal 245-2 changes state as a consequence of an SEU, such a state change of only one signal after the initial value of signal 250 is latched or stored in latch 550 will not change the state of output 250. Signals 240' and 245-2 can be positioned, e.g., the components placed and the signals routed, far enough away from one another so that a state change from an SEU on one of signals 240' (or 240) or 245-2 will not cause a state change on the other.

In another aspect, the transistors of latch 550 are designed using a minimum size. By comparison, NMOS 510, NMOS 520, PMOS 505, and PMOS 515 can be sized to be approximately twice the size the transistors of latch 550. As noted, SEU immunity is achieved in that latch 550 changes state only when both signals 240' and 245-1 change state when in the second mode of operation.

A small window may exist in which a strike to flop 210 and latch 550 concurrently may cause an SEU. Similarly, a small window may exist in which a strike to flop 215 and latch 550 may cause an SEU. Such conditions can be avoided, however, by proper layout and placement flops 210 and 215. More particularly, flops 210 and 215 can be located a sufficient distance from one another so that a single strike is unlikely to hit or affect both flops 210 and 215. Further, the probability of separate strikes on flop 210 and flop 215 or on a storage latch and a flop before a next clock edge arrives is remote.

Using a standard cell version of a flop as a reference, the technique illustrated in FIGS. 2-5 requires approximately a 30% increase in area for a CLB. As the flops used within the CLB become more complex, however (with one or more other inputs), the increase in area to implement the dual mode operation becomes smaller and, in some cases, negligible as previously noted.

In one aspect, a programmable IC can be implemented to include one or more CLBs as described with reference to FIGS. 2-5. For example, one or more CLBs in a column can be implemented as conventional CLBs and one or more CLBs in the same column can be implemented as the dual mode CLBs described with reference to FIGS. 2-5. In another example, the programmable IC can include one or more columns of conventional single mode CLBs and one or more columns of dual mode CLBs. In still another example, all columns of CLBs of the programmable IC can be implemented as dual mode CLBs as described with reference to FIGS. 2-5. While columnar architectures are utilized for purposes of example, it should be appreciated that a programmable IC, or any other IC, can include one or more or the configurable circuit blocks described with any of a variety of other circuit structures including conventional configurable circuit blocks and not have a columnar architecture.

Figure 6:
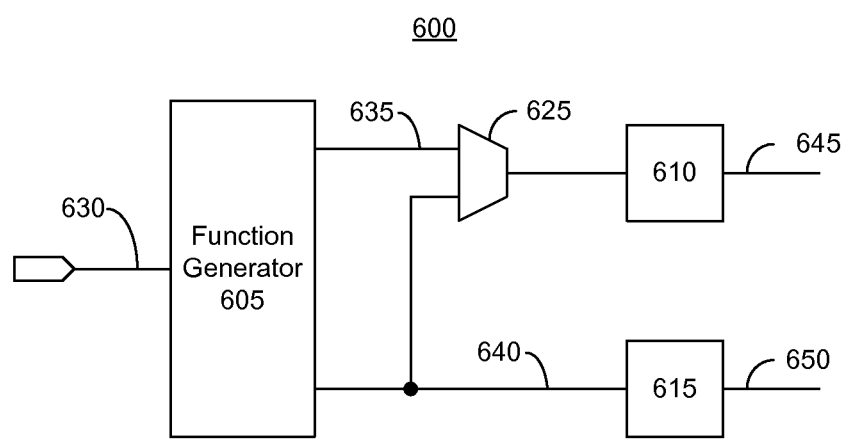
FIG. 6 is a block diagram illustrating another exemplary portion of a configurable circuit block.

FIG. 6 is a block diagram illustrating another exemplary portion of a configurable circuit block. In one aspect, FIG. 6 illustrates another exemplary implementation of a portion of CLB that is configurable for dual mode operation. The circuitry illustrated in FIG. 6 is similar to that illustrated in FIG. 2. For example, the circuitry in FIG. 6 is part of a configurable circuit block that includes a function generator 605 that receives a signal 630 and has two independent outputs. A first output of function generator 605 generates signal 635, which is provided to an input of multiplexer 625. A second output of function generator 605 generates signal 640, which is provided to an input of flop 615 and to an input of multiplexer 625. Signal 635 and signal 640 can be independent of one another.

Flop 610 generates a clocked version of the signal, e.g., signal 635 or signal 640, passed from multiplexer 625. Thus, signal 645, as generated by flop 610, is either a clocked version of signal 635 or a clocked version of signal 640. Flop 615 generates signal 650, which is a clocked version of signal 640. Unlike the circuit structure of FIGS. 2 and 3, however, flop 610 does not have a second output that is provided to flop 615. Further, flop 615 does not have an SEU input or a C-element block contained therein. Rather, the C-element block is implemented elsewhere on the IC in which the circuitry of FIG. 6 is implemented.

When implementing the first mode of operation, multiplexer 625 is set by configuration data, e.g., one or more configuration memory cells programmed to provide the necessary control signal to multiplexer 625, to pass signal 635 to the input of flop 610. In that case, flop 610 outputs a clocked version of signal 635 as signal 645. Flop 615 receives signal 640 and outputs a clocked version of signal 640 as signal 650.

When implementing the second mode of operation, the circuit structure illustrated in FIG. 6, when connected to a C-element block elsewhere, provides increased protection from SEUs. In the second mode of operation, multiplexer 625 is set to pass signal 640 to the input of flop 610. Flop 610 outputs a clocked version of signal 640 as signal 645. Flop 615 receives signal 640 and generates a clocked version of signal 640 as signal 650. Signals 645 and 650 are equivalent except in the case that one signal changes state as a consequence of an SEU.

Both signals 645 and 650 can be provided to a C-element block implemented elsewhere on the IC. In one aspect, an IC can be implemented to include one or more configurable circuit blocks as described with reference to FIG. 6. For example, one or more configurable circuit blocks in a column can be implemented as conventional CLBs and one or more blocks in the same column can be implemented as the dual mode configurable circuit blocks as described with reference to FIG. 6. In that case, C-element blocks are implemented elsewhere in the IC. The dual mode configurable circuit blocks can be connected to the C-element blocks though the interconnect circuitry of the IC.

In another example, the IC can include one or more columns of conventional, single mode CLBs and one or more columns of dual mode configurable circuit blocks as described with reference to FIG. 6. In that case, one or more columns of C-element blocks can be included that can be selectively connected to different ones of the dual mode configurable circuit blocks through the programmable interconnect circuitry of the IC. In still another example, all columns of CLBs of the programmable IC can be implemented as dual mode configurable circuit blocks as described with reference to FIG. 6. Again, one or more columns of C-element blocks can be included so that the dual mode configurable circuit blocks can be connected to C-element blocks as described with reference to FIG. 5 using programmable circuitry of the IC when using the second mode of operation.

Figure 7:
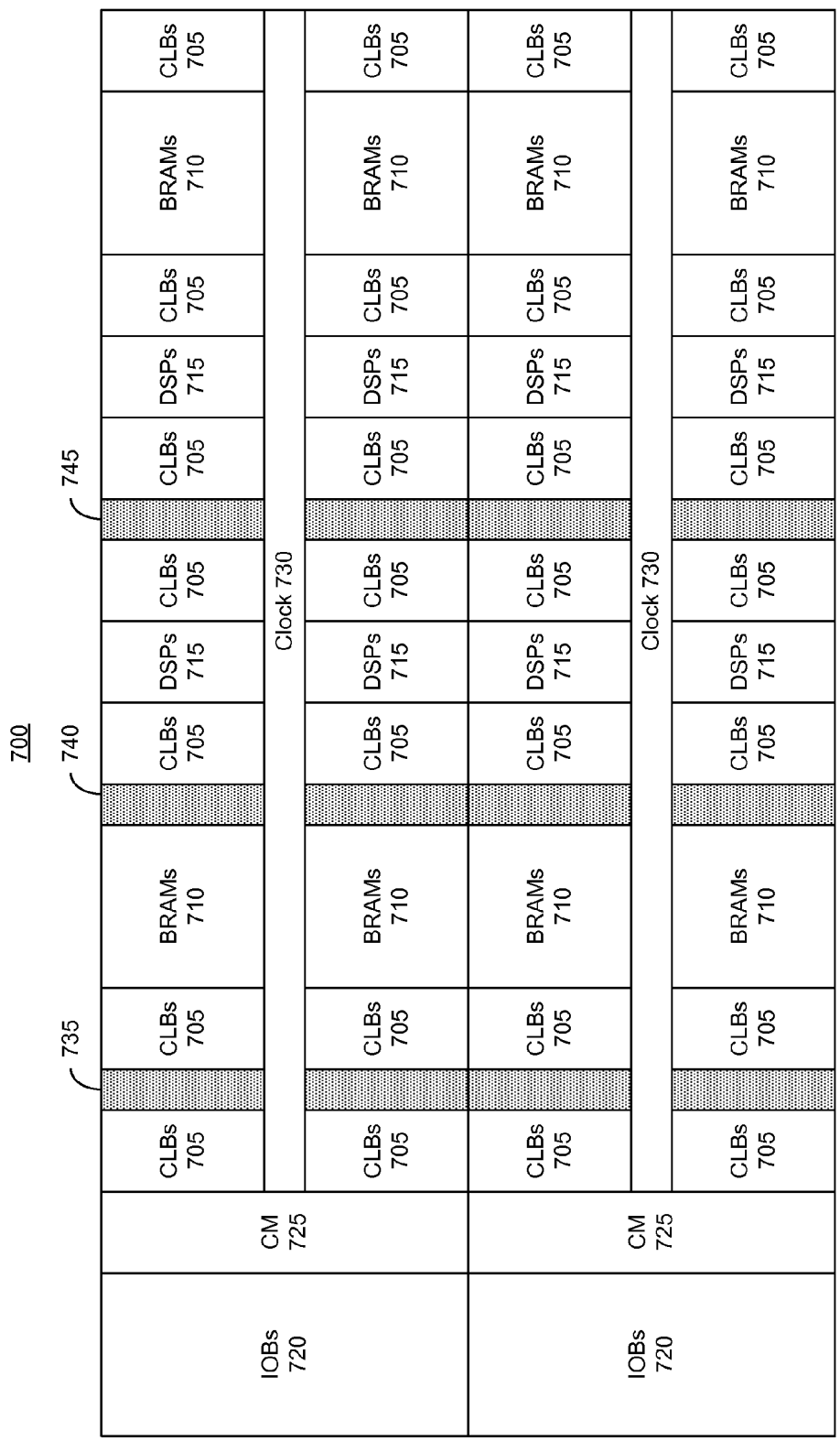
FIG. 7 is a block diagram illustrating an exemplary architecture for an IC.

FIG. 7 is a block diagram illustrating an exemplary architecture 700 for an IC. In one aspect, the IC is programmable. Architecture 700 illustrates an example in which the IC includes columns of CLBs 705 that are configurable to implement either the first mode of operation or the second mode of operation in accordance with FIG. 6. Architecture 700 further includes columns of BRAMs 710, DSPs 715. A column of IOBs 720 is included as is a column of clock manager (CM) blocks 725. Clock circuitry 730 is implemented as two rows cutting across various ones of the columns of configurable circuit blocks as shown. For ease of illustration, each block shown can represent more than one instance of the particular circuit block illustrated. For example, one CLB 705 can represent more than one actual CLB in architecture 700.

In the example illustrated in FIG. 7, additional columns 735, 740, and 745 are included and shown with shading. Column 735-745 each include a plurality of circuit blocks. The circuit blocks in this example are C-element blocks as described with reference to FIG. 5. Using architecture 700, each one of the CLBs 705, when configured to implement the second mode of operation, can be connected to a C-element block within one of columns 735, 745, and/or 750. Columns 735-750 of C-element blocks require relatively little area as compared to other circuit blocks. In another aspect, C-element blocks in columns 735, 745, and/or 750 can be connected to BRAMs 710.

In another aspect, a column of CLBs can be separated from the column of C-element blocks by one or more circuit blocks. While FIG. 7 illustrates each column of C-element blocks bordering on a column of CLBs, this need not be the case.

The exemplary circuit structure shown in FIG. 6 and used in FIG. 7 does not incur a performance penalty when implementing the first mode of operation as is the case with the circuit structure described with reference to FIG. 2 since the C-element block is not utilized in the signal path. More particularly, the circuit structure of FIG. 6, when operating in the first mode of operation, does not utilize the C-element block at all. Further, although the circuit structure of FIG. 2 incurs less of an area penalty than other conventional SEU mitigation techniques, the configurable circuit block of FIG. 6 does not incur any area penalty. For example, a configurable circuit block implemented as described with reference to FIG. 6 requires less area than a configurable circuit block implemented as described with reference to FIG. 2.

Further, the additional area consumed by columns of C-element blocks, as shown in FIG. 7, is less than the area penalty incurred were one to include columns of configurable circuit blocks as described with reference to FIG. 2. The reduced area achieved in FIG. 7, at least in part, is due to the limited interconnect resources used for the C-element blocks. For example, as noted, C-element blocks can be limited to connecting only to selected programmable circuit blocks such as CLBs 705 and/or only to BRAMs 710 or to particular columns of CLBs 705 and/or BRAMs 710. As an illustration, an IC in which approximately 10% of the CLBs are able to be connected to a C-element block that is separate from the CLB incurs approximately 0.025% area increase over an IC including only conventional CLBs.

While the circuit structure of FIG. 6 does not incur a performance penalty when implementing the first mode of operation, the circuit structure of FIG. 6 may consume more power than the circuit structure of FIG. 2 as more interconnect circuitry is required to reach the C-element block. Further, performance of the circuit structure of FIG. 2 in the second mode of operation is likely faster over the circuit structure of FIG. 6 as no interconnect circuitry is needed to reach the C-element block.

In still another example, both types of dual mode configurable circuit blocks can be included in a single IC. For instance, a column of configurable circuit blocks implemented as described with reference to FIG. 2 can be included as can a column of configurable circuit blocks as described with reference to FIG. 6. In that case, one or more columns of voter circuits would be required to fully implement the second mode of operation for the configurable circuit blocks conforming to FIG. 6.

Figure 8:
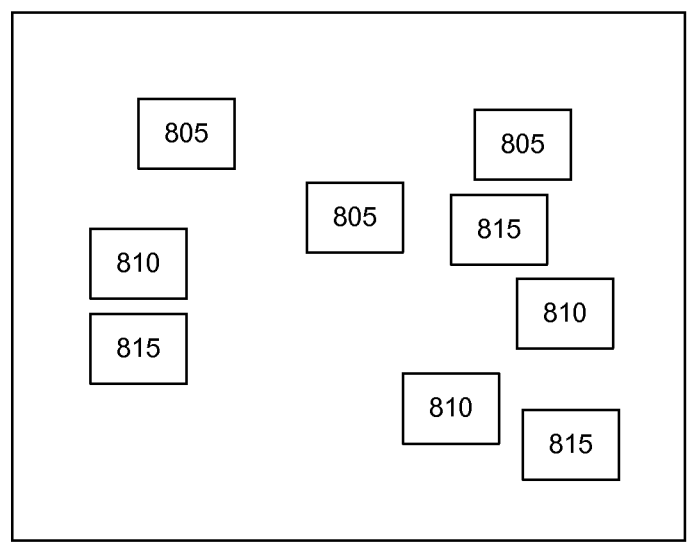
FIG. 8 is a block diagram illustrating another exemplary architecture for an IC.

FIG. 8 is a block diagram illustrating an exemplary architecture for an IC 800. IC 800, which can be a programmable IC, includes one or more configurable circuit blocks that can be configured for dual mode operation. For example, blocks 805 can implement the configurable circuit block described with reference to FIG. 2. Blocks 810 can implement the configurable circuit block described with reference to FIG. 6. Blocks 815 can implement the C-element block described with reference to FIG. 5.

FIG. 8 illustrates that an IC need not have a columnar architecture to use one or more of the configurable circuit blocks disclosed within this specification. Further, it should be appreciated that IC 800 can include only configurable circuit blocks 805, only configurable circuit blocks 810 with C-elements 815, or a combination of both as illustrated. One or more other types of circuit blocks can be included though not pictured.

This specification describes various implementations of a configurable circuit block that is configurable to function in one of two different modes of operation. The first mode of operation is a normal operating mode. The second mode of operation provides increased resistance to SEUs. In a typical data path including a flop, the flop is vulnerable to an SEU during the entirety of the clock signal. In the second mode of operation using the C-element block, the output from the voter circuit is not vulnerable to an SEU on any individual node once data is latched in the C-element block, e.g., by latch 550. Accordingly, vulnerability of the configurable circuit block is reduced from the full clock cycle to a time period significantly less than the full clock cycle. In a circuit design clocked at 400 MHz, for example, the conventional vulnerability window is approximately 2,500 picoseconds. When implementing the second mode of operation as described within this specification, the window of vulnerability is reduced to approximately 150-200 picoseconds.

For purposes of explanation, specific nomenclature is set forth to provide a thorough understanding of the various inventive concepts disclosed herein. The terminology used herein, however, is for the purpose of describing particular embodiments only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. A circuit block within an integrated circuit, the circuit block comprising:
   a multiplexor configured to pass either a first signal or a second signal;
   wherein the first signal is independent of the second signal;
   a first flip-flop configured to receive an output of the multiplexor;
   wherein the first flip-flop has a first output and a second output;

a second flip-flop comprising a first input configured to receive the second signal and a single event upset input coupled to a C-element block within the second flip-flop;

wherein in a first mode of operation:
- the multiplexor passes the first signal to the first flip-flop; and
- the first flip flop and the second flip-flop operate independently of one another with the second output of the first flip-flop gated so as to not transition; and wherein in a second mode of operation:
- the multiplexor passes the second signal to the first flip-flop;
- the first flip-flop and the second flip-flop both receive the second signal; and
- a first result signal generated by the second output of the first flip-flop is provided to the single event upset input of the second flip-flop bypassing a D-type element of the second flip-flop through which the second signal provided to the first input of the second flip-flop is processed.

2. The circuit block of claim 1, wherein the second output of the first flip-flop is provided through an additional driver within the first flip-flop.

3. The circuit block of claim 2, wherein the first output of the first flip-flop is not coupled to the single event upset input or the C-element block.

4. The circuit block of claim 2, further comprising:
a function generator configured to generate the first signal and the second signal;
wherein both the first signal and the second signal are generated according to a function of an input signal to the function generator.

5. The circuit block of claim 4, wherein the function generator comprises a look-up table configured to generate the first signal and the second signal.

6. The circuit block of claim 1, wherein the first signal is generated using a first function and the second signal is generated using a second and different function.

7. The circuit block of claim 6, wherein the first result signal is selectively gated preventing transitioning of the first result signal according to the mode of operation.

* * * * *